(12) United States Patent
Iizuka et al.

(10) Patent No.: US 8,852,387 B2
(45) Date of Patent: Oct. 7, 2014

(54) PLASMA PROCESSING APPARATUS AND SHOWER HEAD

(75) Inventors: Hachishiro Iizuka, Yamanashi (JP); Jun Abe, Yamanashi (JP); Akihiro Yokota, Yamanashi (JP); Takeshi Ohse, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 893 days.

(21) Appl. No.: 13/036,369

(22) Filed: Feb. 28, 2011

(65) Prior Publication Data

US 2011/0214814 A1 Sep. 8, 2011

Related U.S. Application Data

(60) Provisional application No. 61/317,521, filed on Mar. 25, 2010.

(30) Foreign Application Priority Data

Mar. 2, 2010 (JP) .................................. 2010-044916

(51) Int. Cl.
*H01L 21/3065* (2006.01)
*C23C 16/455* (2006.01)
*C23F 1/08* (2006.01)
*H05H 1/24* (2006.01)

(52) U.S. Cl.
CPC ............... *C23F 1/08* (2013.01); *H01L 21/3065* (2013.01); *C23C 16/455* (2013.01); *H05H 1/24* (2013.01)
USPC ............ 156/345.34; 156/345.33; 156/345.43; 156/345.47; 118/715; 118/723 E

(58) Field of Classification Search
USPC ............ 156/345.33, 345.34, 345.43, 345.47; 118/715, 723 E
See application file for complete search history.

(56) References Cited

U.S. PATENT DOCUMENTS

| | | | | |
|---|---|---|---|---|
| 4,209,357 A | * | 6/1980 | Gorin et al. ................... | 438/710 |
| 4,579,618 A | * | 4/1986 | Celestino et al. ........ | 156/345.44 |
| 4,590,042 A | * | 5/1986 | Drage ...................... | 422/186.06 |
| 4,793,975 A | * | 12/1988 | Drage ...................... | 422/186.05 |
| 5,422,139 A | * | 6/1995 | Fischer ..................... | 427/248.1 |
| 6,537,418 B1 | * | 3/2003 | Muller et al. ............ | 156/345.34 |
| 8,282,769 B2 | * | 10/2012 | Iizuka ...................... | 156/345.34 |
| 8,366,828 B2 | * | 2/2013 | Iizuka ........................... | 118/715 |

(Continued)

FOREIGN PATENT DOCUMENTS

| | | |
|---|---|---|
| JP | 2005-217300 A | 8/2005 |
| JP | 2012186223 A * | 9/2012 |

*Primary Examiner* — Jeffrie R Lund
(74) *Attorney, Agent, or Firm* — Pearne & Gordon LLP

(57) ABSTRACT

There is provided a plasma processing apparatus including: a shower head installed within a processing chamber for processing a substrate and facing a mounting table for mounting the substrate; a multiple number of gas exhaust holes formed through the shower head to be extended from a facing surface of the shower head to an opposite surface to the facing surface; a multiple number of openable and closable trigger holes formed through the shower head to be extended from the facing surface of the shower head to the opposite surface, and configured to allow plasma leakage from the facing surface to the opposite surface; and a partition wall installed in a gas exhaust space provided on the side of the opposite surface of the shower head to divide the gas exhaust space into a multiple number of regions, each region communicating with one or more trigger holes.

8 Claims, 4 Drawing Sheets

(56) References Cited

U.S. PATENT DOCUMENTS

| | | | |
|---|---|---|---|
| 8,431,996 B2* | 4/2013 | Sakamoto et al. | 257/350 |
| 2009/0236041 A1* | 9/2009 | Iizuka | 156/345.34 |
| 2010/0230051 A1* | 9/2010 | Iizuka | 156/345.34 |
| 2010/0230052 A1* | 9/2010 | Iizuka | 156/345.34 |
| 2011/0061813 A1* | 3/2011 | Iizuka et al. | 156/345.34 |
| 2011/0067815 A1* | 3/2011 | Iizuka et al. | 156/345.26 |
| 2011/0132542 A1* | 6/2011 | Iizuka | 156/345.33 |
| 2011/0214814 A1* | 9/2011 | Iizuka et al. | 156/345.34 |
| 2011/0284165 A1* | 11/2011 | Iizuka | 156/345.34 |
| 2012/0115314 A1* | 5/2012 | Sakamoto et al. | 438/479 |
| 2014/0023794 A1* | 1/2014 | Mahajani et al. | 427/535 |

* cited by examiner

PLASMA PROCESSING APPARATUS AND SHOWER HEAD

CROSS-REFERENCE TO RELATED APPLICATION

This application claims the benefit of Japanese Patent Application No. 2010-044916 filed on Mar. 2, 2010, and U.S. Provisional Application Ser. No. 61/317,521 filed on Mar. 25, 2010, the entire disclosures of which are incorporated herein by reference.

FIELD OF THE INVENTION

The present disclosure relates to a plasma processing apparatus and a shower head.

BACKGROUND OF THE INVENTION

In the field of manufacture of a semiconductor device or the like, a shower head for supplying a gas toward a substrate such as a semiconductor wafer in a shower pattern has been conventionally used. To be specific, in a plasma processing apparatus that performs a plasma etching process on a substrate such as a semiconductor wafer, a mounting table for mounting the substrate thereon is installed in a processing chamber, and the shower head is installed so as to face the mounting table. The shower head is provided with a multiple number of gas discharge holes on its surface facing the mounting table, and a gas is supplied toward the substrate through the gas discharge holes in a shower pattern.

In such a plasma processing apparatus, along with a trend toward scaling-up of a semiconductor wafer, it is required to uniformly perform a plasma process on an entire surface of a semiconductor wafer of a large diameter. Therefore, there has been known a technique for confining plasma between a mesh-shaped anode electrode and a cathode electrode which mounts thereon a semiconductor substrate in a processing chamber by covering the cathode electrode with the anode electrode (see, e.g., Patent Document 1).
Patent Document 1: Japanese Patent Laid-open Publication No. 2005-217300

As described above, in the plasma processing apparatus, due to the trend toward scaling-up of a semiconductor wafer, it is difficult to uniformly process an entire surface of a semiconductor wafer having a large diameter. Accordingly, there has been demanded development of a plasma processing apparatus capable of improving processing uniformity in the surface of the semiconductor wafer.

BRIEF SUMMARY OF THE INVENTION

In view of the foregoing, the present disclosure provides a plasma processing apparatus and a shower head capable of improving uniformity of a plasma process in the substrate surface by controlling plasma density distribution in a processing space.

In accordance with one aspect of the present disclosure, there is provided a plasma processing apparatus including: a shower head that is installed within a processing chamber for processing a substrate therein and faces a mounting table for mounting thereon the substrate, the shower head being configured to supply a gas toward the substrate in a shower pattern through a multiple number of gas discharge holes provided in a facing surface of the shower head facing the mounting table; a multiple number of gas exhaust holes formed through the shower head to be extended from the facing surface of the shower head to an opposite surface to the facing surface; a multiple number of openable and closable trigger holes that is formed through the shower head to be extended from the facing surface of the shower head to the opposite surface, and is configured to allow plasma leakage from the facing surface to the opposite surface; and a partition wall installed in a gas exhaust space provided on the side of the opposite surface of the shower head to divide the gas exhaust space into a multiple number of regions, each region communicating with one or more trigger holes.

In accordance with another aspect of the present disclosure, there is provided a shower head that is installed in a processing chamber for processing a substrate therein so as to face a mounting table for mounting the substrate thereon, and supplies a gas toward the substrate in a shower pattern through a multiple number of gas discharge holes provided in a facing surface of the shower head facing the mounting table. The shower head includes a multiple number of gas exhaust holes formed through the shower head to be extended from the facing surface to an opposite surface to the facing surface; a multiple number of openable/closable trigger holes penetrated from the facing surface to the opposite surface to allow plasma leakage from the facing surface toward the opposite surface; and a partition wall installed in a gas exhaust space provided on the side of the opposite surface of the shower head to divide the gas exhaust space into a multiple number of regions, each region communicating with one or more trigger holes.

In accordance with the present disclosure, it is possible to provide a plasma processing apparatus and a shower head capable of improving uniformity of a plasma process in the substrate surface by controlling plasma density distribution in a processing space.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Hereinafter, embodiments of the present disclosure will be described in detail with reference to the accompanying drawings.

Figure 1:
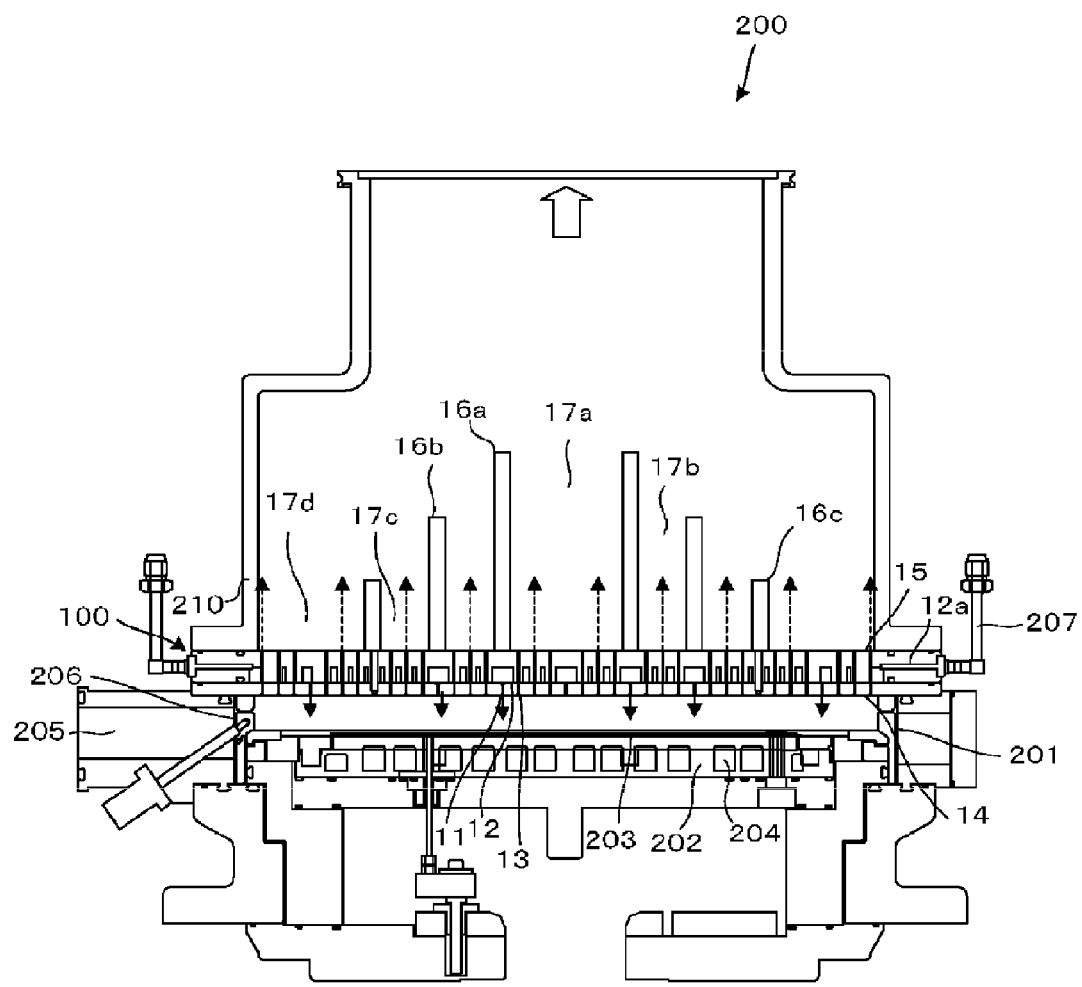
FIG. 1 is a longitudinal cross sectional view illustrating a configuration of a plasma processing apparatus in accordance with an embodiment of the present disclosure.
Figure 2:
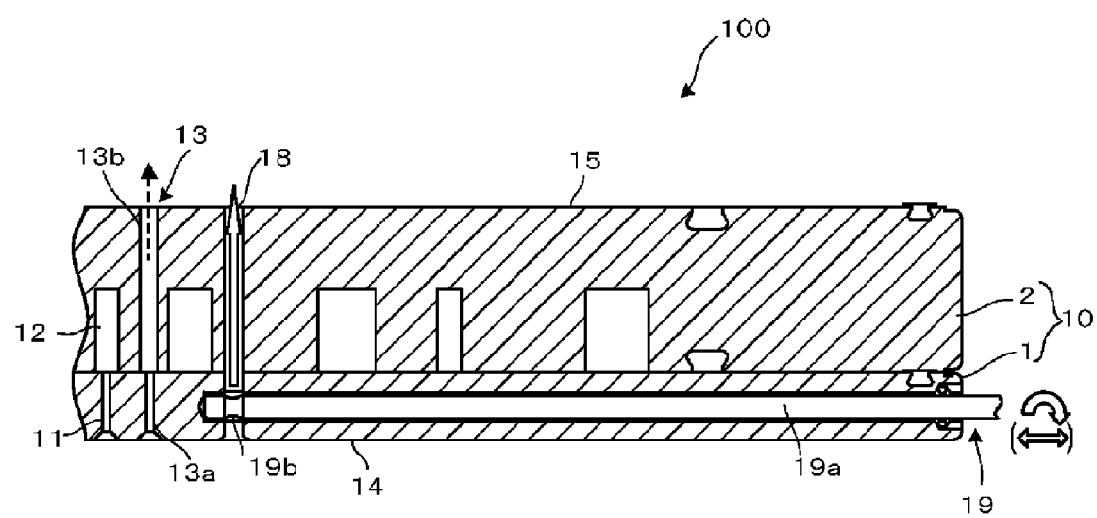
FIG. 2 is a longitudinal cross sectional view illustrating a configuration of major parts of a shower head in accordance with the embodiment of the present disclosure.
Figure 3:
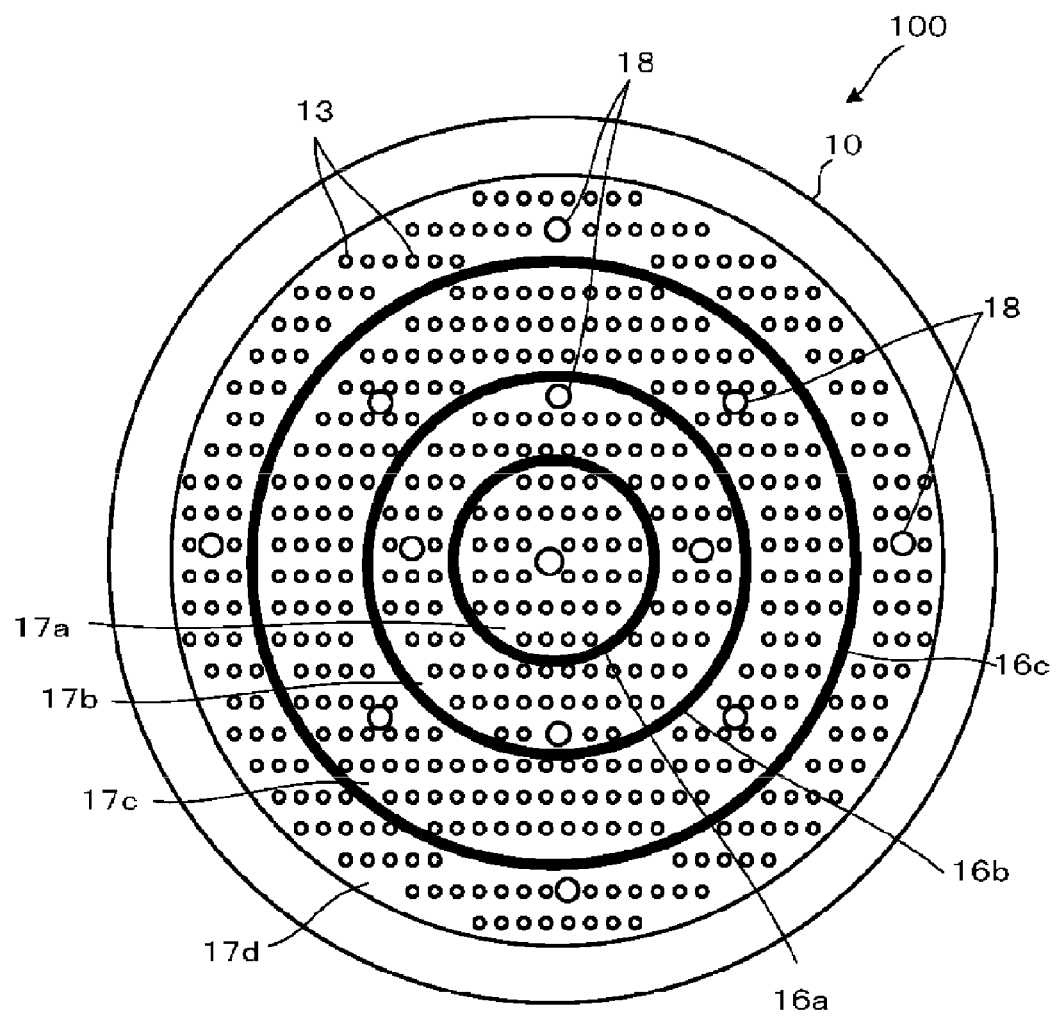
FIG. 3 is a top view of the shower head in accordance with the embodiment of the present disclosure.

FIG. 1 illustrates a cross sectional configuration of major parts of a plasma etching apparatus 200 as a plasma processing apparatus in accordance with an embodiment of the present disclosure. FIG. 2 is a cross sectional view illustrating a configuration of major parts of a shower head 100 installed in the plasma etching apparatus 200. FIG. 3 is a top view of the shower head 100.

As illustrated in FIG. 2, the shower head 100 is made up of a layered body 10 having two sheets of plate-shaped members: a lower member 1 and an upper member 2 placed on the top of the lower member 1. By way of example, the lower member 1 and the upper member 2 are made of aluminum of which surface is anodically oxidized. As shown in FIG. 1, the shower head 100 is installed in a processing chamber 201 of the plasma etching apparatus 200 so as to face a mounting table 202 that mounts a semiconductor wafer (substrate) thereon. That is, the lower member 1 shown in FIG. 2 is installed to serve as a surface 14 facing the mounting table 202 shown in FIG. 1.

In the layered body 10, the lower member 1 having the surface 14 facing the mounting table 202 is provided with a multiple number of gas discharge holes 11 (only one of them is shown in FIG. 2), and a gas flow path 12 communicating with the gas discharge holes 11 is formed between the lower member 1 and the upper member 2. The gas discharge holes 11 are configured to supply a gas toward the substrate (lower side of FIG. 1) in a shower pattern, as indicated by arrows in FIG. 1. Further, a gas inlet 12a through which the gas is introduced into the gas flow path 12 is provided in a peripheral area of the layered body 10.

Further, a multiplicity of gas exhaust holes 13 (only one is shown in FIG. 2) are formed through the layered body 10, i.e., through the lower member 1 and the upper member 2. The gas exhaust holes 13 serve as a gas exhaust mechanism that performs evacuation so as to allow the gas to flow from a substrate side (lower side of the drawing) toward an opposite side to the substrate (upper side of the drawing), as indicated by dotted-line arrows in FIGS. 1 and 2. As shown in FIG. 2, each gas exhaust hole 13 has a small diameter part 13a, which is formed in the lower member 1, having a diameter of, e.g., about 0.5 mm to about 1.5 mm and a large diameter part 13b, which is formed in the upper member 2, having a diameter of, e.g., about 2.0 mm to about 5.0 mm.

The gas exhaust holes 13 are uniformly distributed over the entire area of the shower head 100 except its peripheral area (configured as a fixing part to be fixed to the processing chamber 201), as illustrated in FIG. 3. For example, in case that the shower head 100 is designed to process a semiconductor wafer having a diameter of about 12 inches (about 300 mm), the number of the gas exhaust holes 13 may be about 2000 to about 2500. Further, in the present embodiment, the shower head 100 has an appearance of a circular plate shape conforming to the shape of the semiconductor wafer to be processed.

Further, as shown in FIGS. 1 and 3, partition walls 16a to 16c are installed on the side of the upper member 2 of the layered body 10, i.e., on an opposite surface (rear surface) 15 to the surface 14 facing the mounting table 202. The partition walls 16a to 16c are made of quartz and formed in a cylindrical shape so as to partition a gas exhaust space into concentric circular regions. Further, one or more trigger holes 18 are formed in each of regions 17a to 17d partitioned by the partition walls 16a to 16c. The partition walls 16a to 16c may be made of an insulating material other than quartz, or may also be made of a semiconductor, a conductor or the like.

As shown in FIG. 2, the trigger hole 18 is formed through the shower head 100 to be extended from the surface 14 facing the mounting table 202 to the opposite surface 15 so as to allow plasma leakage from the facing surface 14 toward the rear surface 15. Moreover, each of the trigger holes 18 is provided with an opening/closing mechanism capable of opening and closing the trigger hole 18.

The trigger holes 18 have a diameter (e.g., about 2 mm) larger than that of the small diameter portion 13a of the gas exhaust holes 13 and can be independently opened and closed by the opening/closing mechanism such as a rotation valve 19. Further, in the rotation valve 19, a rotational shaft 19a having a larger diameter than that of the trigger hole 18 is inserted through the trigger hole 18 from a lateral side. If the rotational shaft 19a is rotated to align the position of a through hole 19b formed in the rotational shaft 19a with the position of the trigger hole 18, the trigger hole 18 is opened, whereas if the rotational shaft 19a is rotated to allow the position of the through hole 19b to be deviated from the position of the trigger hole 18, the trigger hole 18 is closed.

As stated above, the diameter of the trigger hole 18 is larger than that of the small diameter portion 13a of the gas exhaust hole 13, and plasma may leak from the processing space toward a gas exhaust space through the trigger hole 18 more easily, as compared to a case where the plasma passes through the gas exhaust hole 13. Accordingly, in a state that the plasma does not leak from the processing space toward the gas exhaust space through the gas exhaust hole 13, the trigger hole 18 is opened, and, thus, plasma can be actively leaked.

If the opening/closing mechanism for opening and closing the trigger hole 18 requires a short time of about one second or less, e.g., about several tens of milliseconds for the opening/closing operation, the plasma leakage state can be controlled in a cycle of a short time. In this case, the plasma leak state can be controlled in a pulse pattern by repetitively performing the opening/closing operation in a short time. Furthermore, as the opening/closing mechanism for performing the opening/closing operation, in addition to the operation of rotating the valve, a reciprocating operation or an operation of deforming a diaphragm can be employed.

As shown in FIG. 3, a multiple number of trigger holes 18 is formed, and one or more trigger holes 18 are positioned in each of the regions 17a to 17d partitioned by the partition walls 16a to 16c. In the example shown in FIG. 3, a single trigger hole 18 is positioned in the innermost region 17a, and four trigger holes 18 are positioned on a circumference in each of the regions 17b to 17d at same intervals (about 90°). The trigger holes 18 in the region 17c are formed at positions deviated from those of the trigger holes 18 in the regions 17b and 17d by about 45° in the circumferential direction. The number and the positions of the trigger holes 18 can be changed without being limited to those shown in FIG. 3.

By way of example, if the plasma density at the peripheral region of the processing space tends to be lower than that at the central region of the processing space, the uniformity of the plasma density in the processing space can be improved by controlling the trigger holes 18 such that the plasma leak at the peripheral region occurs while the plasma leak at the central region does not occur so as to move electrons or ions in the central region of the processing space toward the peripheral region of the processing space. In addition, the trigger holes 18 can be controlled such that the plasma density has a gradient (non-uniform distribution). For example, when all the trigger holes 18 are closed, the plasma may be concentrated in a certain location other than the central area of the shower head 100 (the processing chamber 201). In that case, the position of the plasma can be adjusted to the central area by opening the trigger holes 18.

When the plasma leaks to the rear surface 15 of the shower head 100 by opening the trigger holes 18, the plasma that has leaked from the central trigger hole 18 and the plasma that has leaked from the peripheral trigger holes 18 may be coupled together on the rear surface 15 of the shower head 100. The partition walls 16a to 16c prevent the plasma that has leaked to the rear surface 15 of the shower head 100 from being coupled with each another. Moreover, the plasma that has leaked from the different trigger holes 18 formed in each of the regions 17a to 17d partitioned by the partition walls 16a to 16c may be coupled with each other.

Accordingly, in the example shown in FIG. 1, three partition walls 16a to 16c are installed so as to divide the space into four concentric circular regions 17a to 17d, and the plasma density in each of the regions can be controlled independently. Alternatively, the partitioned regions may be, e.g., fan-shaped regions that are symmetrical with respect to a center point or asymmetrical regions, without being limited to the concentric circular regions. The number of regions partitioned by the partition walls is not limited as long as it is greater than or equal to two. However, it is desirable to provide three or more regions in order to uniformly perform the plasma process on the entire surface of the semiconductor wafer by controlling the plasma in each region. If the number of regions partitioned by the partition walls is increased excessively, the configuration of the apparatus becomes complicated, which may result in deterioration of exhaust conductance. For that reason, it is desirable that the number of regions partitioned by the partition walls is smaller than or equal to six. In other words, the number of regions partitioned by the partition walls may be within the range of three to six.

Further, the partition walls 16a to 16c may have a height at which the plasma that has leaked between the regions partitioned by the partition walls 16a to 16c are prevented from intruding into adjacent regions and being coupled together after passing over the partition walls 16a to 16c. In the example shown in FIG. 1, the heights of the inner partition wall 16a, the intermediate partition wall 16b and the outer partition wall 16c are gradually decreased in sequence.

Figure 4:
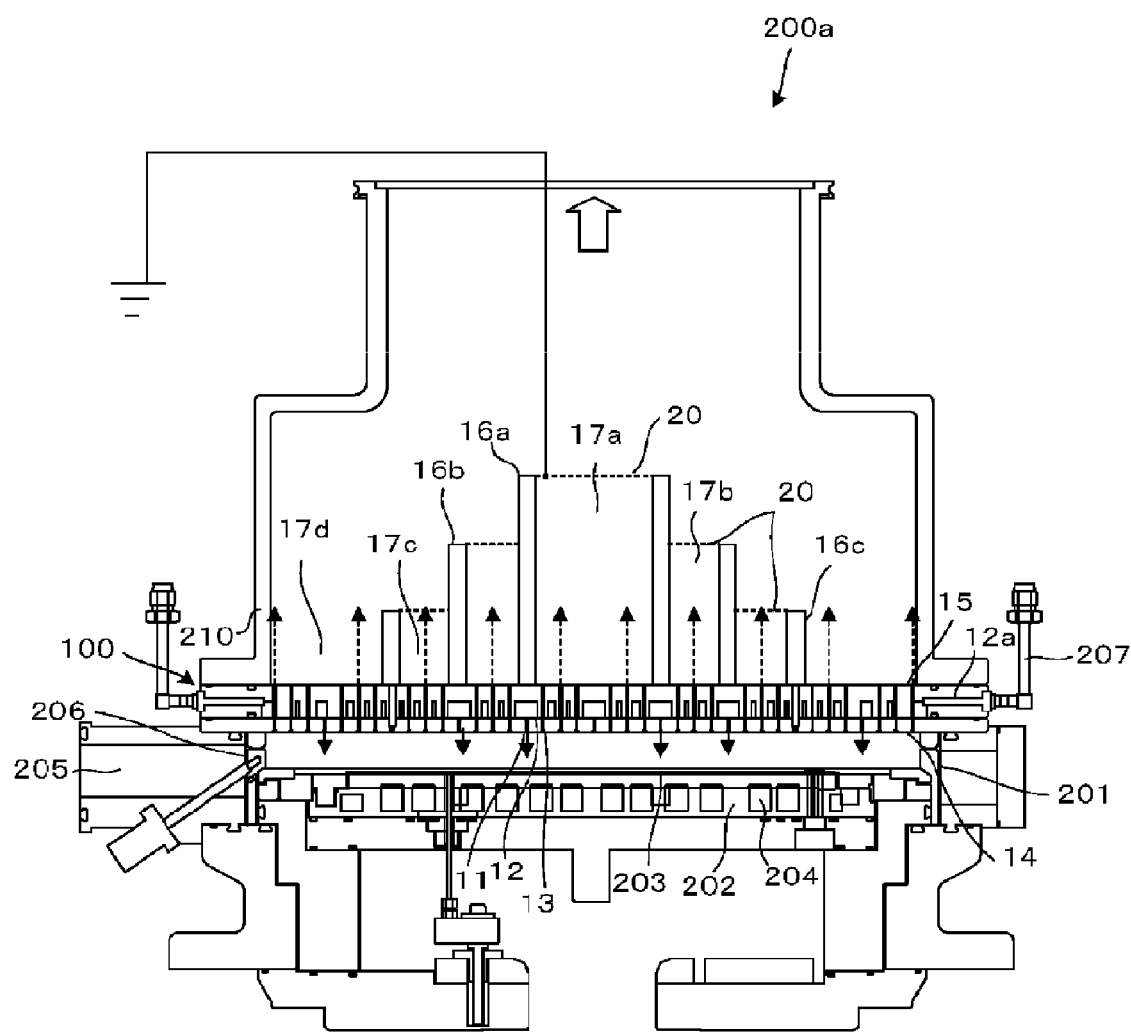
FIG. 4 is a longitudinal cross sectional view illustrating a configuration of a plasma processing apparatus in accordance with another embodiment of the present disclosure.

In this case, as in a plasma etching apparatus 200a shown in FIG. 4, plasma confining electrodes 20 having heights corresponding to those of the partition walls 16a to 16c may be installed at the top of the partition walls 16a to 16c so as to cover the upper portions of the regions 17a to 17c. In the plasma etching apparatus 200a shown in FIG. 4, the plasma confining electrodes 20 are connected to a ground potential. However, a desired voltage may be applied to the plasma confining electrodes 20.

By installing the plasma confining electrodes 20 at the top portions of the partition walls 16a to 16c, it is possible to reliably prevent the plasma in different regions 17a to 17d from being coupled together after passing over the partition walls 16a to 16c. Besides, the plasma confining electrodes 20 may be formed of a mesh-shaped member, a punching metal, an expanded metal having an opening in order to secure the exhaust conductance.

As shown in FIG. 1, the plasma etching apparatus 200 as the substrate processing apparatus having the above-described shower head 100 is configured as a plasma etching apparatus of a capacitively coupled parallel plate type in which upper and lower electrode plates are arranged in parallel to each other and are connected to power supplies (not shown) for plasma generation.

The plasma etching apparatus 200 includes a processing chamber (processing vessel) 201 formed in a cylindrical shape made of, e.g., aluminum of which surface is anodically oxidized. The processing chamber 201 is grounded. The mounting table 202 installed within the processing chamber 201 is configured to mount thereon the semiconductor wafer as a processing target substrate and the mounting table 202 serves as a lower electrode. The mounting table 202 is connected with a non-illustrated power supply for plasma generation.

An electrostatic chuck 203 that electrostatically attracts and holds the semiconductor wafer W thereon is provided on the mounting table 202. The electrostatic chuck 203 includes an electrode embedded in an insulator. The semiconductor wafer is electrostatically attracted and held by a Columbic force generated by a DC voltage applied to this electrode. Further, the mounting table 202 is provided with a flow path 204 through which a temperature control medium is circulated, and, thus, a temperature of the semiconductor wafer attracted to and held on the electrostatic chuck 203 can be regulated to a preset temperature. Furthermore, provided in a sidewall of the processing chamber 201 is an opening 205 through which the semiconductor wafer is loaded into or unloaded from the processing chamber 201, and an opening/closing mechanism 206 for airtightly closing the opening 205 is provided at the opening 205.

The shower head 100 is positioned above the mounting table 202 to face the mounting table 202 at a preset distance. The shower head 100 serving as the upper electrode and the mounting table 202 serving as the lower electrode form a pair of facing electrodes.

The gas inlet 12a of the shower head 100 is connected with a gas supply unit 207 of the processing chamber 201. A processing gas (etching gas) is supplied to the gas supply unit 207 from a non-illustrated gas supply mechanism.

Further, a cylindrical body 210 is provided above the shower head 100, and a vacuum pump (not shown) such as a turbo molecular pump is connected to the cylindrical body 210 via an opening/closing control valve, an opening/closing mechanism, and so forth. The inside of the cylindrical body 210 serves as a gas exhaust path, and the partition walls 16a to 16c are provided in the gas exhaust path of the cylindrical body 210.

In order to perform plasma etching on the semiconductor wafer by the plasma etching apparatus 200, the semiconductor wafer is first loaded into the processing chamber 201 through the opening 205 and is mounted on the electrostatic chuck 203. Then, the semiconductor wafer is electrostatically attracted to and held on the electrostatic chuck 203. Subsequently, the opening 205 is closed, and the inside of the processing chamber 201 is evacuated to a preset vacuum level by the vacuum pump or the like.

Thereafter, a processing gas (etching gas) is supplied from the gas supply unit 207 into the gas inlet 12a of the shower head 100 at a certain flow rate. The processing gas is then supplied toward the semiconductor wafer on the mounting table 202 from the gas discharge holes via the gas flow path 12 of the shower head 100 in a shower pattern.

Then, an internal pressure of the processing chamber 201 is maintained at a preset pressure, and then a high frequency power of a preset frequency such as about 13.56 MHz is applied to the mounting table 202. As a result, a high frequency electric field is generated between the shower head 100 serving as the upper electrode and the mounting table 202 serving as the lower electrode, and the etching gas is dissociated and excited into plasma. Then, the etching process is performed on the semiconductor wafer by the plasma.

In the etching process, the processing gas supplied through the gas discharge holes 11 of the shower head 100 in a shower pattern is exhausted from the multiple number of gas exhaust holes 13 distributed in the shower head 100. Accordingly, unlike a case of exhausting the gas through a lower portion of the processing chamber 201, a gas does not flow from a central portion of the semiconductor wafer toward a peripheral portion of the semiconductor wafer. Thus, the processing gas can be more uniformly supplied to the semiconductor wafer.

Furthermore, as described above, by opening and closing the trigger hole 18, the plasma in the processing space of the processing chamber 201 can be made to leak into the gas exhaust space of the cylindrical body 210 and, thus, a plasma state in the processing space can be controlled. Here, if the plasma that has leaked into the gas exhaust space from the trigger holes 18 is coupled together undesirably, the plasma in the processing space is affected, and this makes it difficult to control the plasma in the processing space by opening and closing the trigger holes 18. On the other hand, in the present embodiment, undesirable coupling of the plasma that has leaked into the gas exhaust space from the trigger holes 18 can be prevented by the partition walls 16a to 16c. Accordingly, since the controllability of plasma in the processing space can be enhanced and the uniformity of plasma in the processing space can be improved, uniform etching can be performed on each area of the semiconductor wafer. That is, process uniformity in the wafer surface can be improved.

Such a plasma control may be performed by a control mechanism that controls the opening and closing of the trigger hole 18 by the rotation of the rotation valve 19, based on a measurement result obtained by a measurement unit that measures a plasma state within the processing chamber 201. The measurement unit may be, for example, a plasma monitor that detects the plasma state from a light emission state of plasma.

Upon the completion of the plasma etching process, the application of the high frequency power and the supply of the processing gas are stopped, and the semiconductor wafer is unloaded from the processing chamber 201 in the reverse order to that described above.

As discussed above, in the plasma etching apparatus 200 and the plasma etching apparatus 200a in accordance with the present embodiment, the plasma within the processing space can be generated uniformly, so that uniform etching process can be performed on each area of the semiconductor wafer.

Moreover, in the plasma etching apparatus 200 and the plasma etching apparatus 200a as described above, since the gas is exhausted through the gas exhaust holes 13 of the shower head 100, a gas exhaust path need not be provided in the vicinity of the mounting table 202 or the shower head 100, unlike in conventional cases. Therefore, a diameter of the processing chamber 201 can be made similar to an outer diameter of the semiconductor wafer as a processing target substrate, so that the size of the apparatus can be reduced. Furthermore, since the vacuum pump is installed above the processing chamber 201 and the gas is exhausted from a region closer to the processing space of the processing chamber 201, gas exhaust can be carried out efficiently. Further, since a capacity of the vacuum pump can be reduced, the size of the apparatus can be further reduced.

Although the embodiments of the present disclosure have been described with reference to the accompanying drawings, the present disclosure is not limited to the above-stated embodiments but can be modified in various ways.

What is claimed is:

1. A plasma processing apparatus comprising:
   a shower head that is installed within a processing chamber for processing a substrate therein and faces a mounting table for mounting thereon the substrate, the shower head being configured to supply a gas toward the substrate in a shower pattern through a plurality of gas discharge holes provided in a facing surface of the shower head facing the mounting table;
   a plurality of gas exhaust holes formed through the shower head to be extended from the facing surface of the shower head to an opposite surface to the facing surface;
   a plurality of openable and closable trigger holes that is formed through the shower head to be extended from the facing surface of the shower head to the opposite surface, and is configured to allow plasma leakage from the facing surface to the opposite surface; and
   a partition wall installed in a gas exhaust space provided on the side of the opposite surface of the shower head to divide the gas exhaust space into a plurality of regions, each region communicating with one or more trigger holes.

2. The plasma processing apparatus of claim 1, wherein the trigger holes are configured to be independently openable and closable.

3. The plasma processing apparatus of claim 1, further comprising:
   an opening/closing mechanism for opening and closing the trigger holes in a time of about one second or less.

4. The plasma processing apparatus of claim 1, wherein the partition wall is configured to divide the gas exhaust space into three to six regions.

5. The plasma processing apparatus of claim 1, wherein the partition wall is made of any one of an insulator, a semiconductor and a conductor and arranged so as to form concentric circular regions.

6. The plasma processing apparatus of claim 1, further comprising:
   a plasma confining electrode formed of a member having an opening and provided in the gas exhaust space to cover upper portions of the regions.

7. The plasma processing apparatus of claim 6, wherein the plasma confining electrode is connected to a ground potential.

8. A shower head that is installed in a processing chamber for processing a substrate therein so as to face a mounting table for mounting the substrate thereon, and supplies a gas toward the substrate in a shower pattern through a plurality of gas discharge holes provided in a facing surface of the shower head facing the mounting table, the shower head comprising:
   a plurality of gas exhaust holes formed through the shower head to be extended from the facing surface to an opposite surface to the facing surface;
   a plurality of openable/closable trigger holes penetrated from the facing surface to the opposite surface to allow plasma leakage from the facing surface toward the opposite surface; and
   a partition wall installed in a gas exhaust space provided on the side of the opposite surface of the shower head to divide the gas exhaust space into a plurality of regions, each region communicating with one or more trigger holes.

* * * * *

UNITED STATES PATENT AND TRADEMARK OFFICE
CERTIFICATE OF CORRECTION

Page 1 of 1

PATENT NO.        : 8,852,387 B2
APPLICATION NO.   : 13/036369
DATED             : October 7, 2014
INVENTOR(S)       : Hachishiro Iizuka et al.

It is certified that error appears in the above-identified patent and that said Letters Patent is hereby corrected as shown below:

In the Specification

Column 6, line 45, please add -- 11 -- between "holes" and "via"

Signed and Sealed this
Twenty-fourth Day of February, 2015

Michelle K. Lee
*Deputy Director of the United States Patent and Trademark Office*